United States Patent
Cavers et al.

(10) Patent No.: US 7,187,234 B2
(45) Date of Patent: Mar. 6, 2007

(54) DECORRELATED POWER AMPLIFIER LINEARIZERS

(75) Inventors: James K. Cavers, Richmond (CA); Thomas Johnson, Delta (CA)

(73) Assignee: Andrew Corporation, Westbrook, IL (US)

( * ) Notice: Subject to any disclaimer, the term of this patent is extended or adjusted under 35 U.S.C. 154(b) by 0 days.

(21) Appl. No.: 10/780,658

(22) Filed: Feb. 19, 2004

(65) Prior Publication Data

US 2004/0161053 A1    Aug. 19, 2004

Related U.S. Application Data

(62) Division of application No. 09/982,626, filed on Oct. 18, 2001.

(60) Provisional application No. 60/301,978, filed on Jun. 28, 2001.

(51) Int. Cl.
*H03F 1/26* (2006.01)
*H03F 1/30* (2006.01)

(52) U.S. Cl. .................. 330/149; 330/151; 330/52; 330/149

(58) Field of Classification Search ........... 330/151, 330/149, 52
See application file for complete search history.

(56) References Cited

U.S. PATENT DOCUMENTS

| | | | |
|---|---|---|---|
| 4,379,994 A | 4/1983 | Baumann | 330/149 |
| 4,879,519 A | 11/1989 | Myer | 330/149 |
| 5,130,663 A | 7/1992 | Tattersall, Jr. | 330/52 |
| 5,157,345 A | 10/1992 | Kennington et al. | 330/149 |
| 5,307,022 A | 4/1994 | Tattersall, Jr. et al. | 330/52 |
| 5,485,120 A | 1/1996 | Anvari | 330/151 |
| 5,489,875 A * | 2/1996 | Cavers | 330/151 |
| 5,532,642 A | 7/1996 | Takai | 330/15 |
| 5,565,814 A | 10/1996 | Fukuchi | 330/52 |
| 5,610,554 A | 3/1997 | Anvari | 330/52 |
| 5,617,061 A * | 4/1997 | Fukuchi | 330/151 |
| 5,621,354 A | 4/1997 | Mitzlaff | 330/52 |
| 5,644,268 A | 7/1997 | Hang | 330/151 |
| 5,694,395 A | 12/1997 | Myer et al. | 370/480 |
| 5,742,201 A | 4/1998 | Eisenberg et al. | 330/2 |
| 5,760,646 A | 6/1998 | Belcher et al. | 330/149 |
| 5,789,976 A | 8/1998 | Ghannouchi et al. | 330/52 |
| 5,815,036 A | 9/1998 | Yoshikawa et al. | 330/52 |

(Continued)

FOREIGN PATENT DOCUMENTS

EP    0675594    10/1995

(Continued)

OTHER PUBLICATIONS

S. Grant, "A DSP Controlled Adaptive Feedforward Amplifiedr Linearizer," Jul., 1996.

(Continued)

*Primary Examiner*—Rexford Barnie
*Assistant Examiner*—Josesph Lauture
(74) *Attorney, Agent, or Firm*—Wood, Herron & Evans LLP

(57) ABSTRACT

A linearizer for an amplifier includes an adaptation controller having M monitor signals as inputs. The controller outputs M control settings. The adaptation controller determines M uncorrelated adjustment settings from the M monitor signal inputs. Using the M uncorrelated adjustment settings, the controller adjusts the M control settings for the linearizer.

3 Claims, 10 Drawing Sheets

U.S. PATENT DOCUMENTS

| | | | | |
|---|---|---|---|---|
| 5,831,478 | A | 11/1998 | Long | 330/52 |
| 5,862,459 | A | 1/1999 | Charas | 455/144 |
| 5,867,065 | A | 2/1999 | Leyendecker | 330/149 |
| 5,898,339 | A | 4/1999 | Maruyama et al. | 330/151 |
| 5,912,586 | A | 6/1999 | Mitzlaff | 330/149 |
| 5,923,214 | A | 7/1999 | Mitzlaff | 330/52 |
| 6,075,411 | A | 6/2000 | Briffa et al. | 330/149 |
| 6,166,601 | A | 12/2000 | Shalom et al. | 330/151 |
| 6,208,207 | B1 * | 3/2001 | Cavers | 330/149 |
| 6,414,546 | B2 * | 7/2002 | Cavers | 330/149 |
| 6,456,160 | B1 * | 9/2002 | Nakayama et al. | 330/52 |

FOREIGN PATENT DOCUMENTS

| | | |
|---|---|---|
| JP | 58 175309 | 10/1983 |

OTHER PUBLICATIONS

S. Grant and J. Carvers, "A DSP Controlled Adaptive Feedforward Amplifier Linearizer," ICUPC 1996.

A. Smith, "A Wideband Adaptive Feedforward Amplifier Lineariser," Aug. 1997.

A. Smith and J. Carvers, "A Wideband Architecture For Adaptive Feedforward Linearization," May 18, 1998.

F. Amoroso, "Spectral Containment By PreDistortion of OQPSK Signal," Oct. 1998.

J.Cavers, "Adaption Behavior of a Feedforward Amplifier Linearizer," Feb. 1995.

Q. Cheng, et al., A 1.9 GHZ Adaptive Feedforward Power Amplifier, Nov. 1998.

J.C. Lagarias, et al. Convergence Properties of the Nedler-Mead Simplex Algorithm in Low Dimensions, SAIM J. Optim. May, 1997.

P.B. Kennington and D.W. Bennett, Linear Distortion Correction using Feed-forward System, IEEE Trasnactions on Vehicular Technology vol. 45 No. 1 (Feb. 1996).

J.Chen, et al., Adaptive joint lineraisation / equillisation with delay alignments for a wideband power amplifier, Mar. 1998.

J.T. Chen, H.S. Tsai and Y.K. Chen, Fast Adaptive Wide-band Power Amplifier Feed-forward Linearizer, IEEE Vehicular Technology conference, Ottawa, (1998). No Month.

J.K. Cavers, Convergence Behavior of an Adaptive Feed-forward Linearizer, IEEE Vehicular Technology Conference, (1994), No Month.

F.T. Luk and S. Qiao, Analysis of a Recursive Least-squares Signal Processing Algorithm, Society for Industrial and Applied Mathematics, vol. 10, No. 3, (May 1989).

S. Ljung and L. Ljung, Error Propagation Properties of Recursive Least-squares Adaptation Algorithims, Automatica, vol. 21, No. 2 (1985), No Month.

E. Eweda and O. Macchi, Convergence of the RLS and LMS Adaptive Filters, IEEE Transactions on Circuits and Systems, vol. CAS-34, No. 7, (Jul. 1987).

D.H. Shi and F. Kozin, On Almost Sure Convergence of Adaptive Algorithms, IEEE Transactions on Automatic Control, vol. AC-31, No. 5, (May 1986).

L.L. Horowitz and K.D. Seene, Performance Advantage of Complex LMS for Controlling Narrow-band Adaptive Arrays, IEEE Transactions on Acoustics, Speech, and Signal Processing, vol. ASSP-29, No. 3, (Jun. 1981).

G.A. Clark, S.K. Mitra, and S.R. parker, Block Implementation of Adaptive Digital Filters, IEEE Transactions on Acoustics, Speech, and Signal Processing, vol. ASSP-29, No. 3, (Jun. 1981).

A. Feuer, Performance Analysis of the Block Least Mean Square Algorithm, IEEE Transactions on Circuits and Systems, vol. CAS-32, No. 9, (Jul. 1985).

S.S. Narayan, A.M. Peterson, M.J. Narasimha, Transform Domain LMS Algorithm, IEEE Transactions on Acoustics, Speech, and Signal Processing, vol. ASSP-31, No. 3, (Jun. 1983).

G.A. Clark, S.R. Parker, and S.K. Mitra, A Unified Approach to Time-and Frequency-Domain Realization of FIR Adaptive Digital Filters, IEEE-Transactions on Acoustics, Speech, and Signal Processing, vol. ASSP-31, No. 5, (Oct. 1983).

G. Panda, B. Mulgrew, C.F.N. Cowan, and P.M. Grant, A Self-Orthogonalizing Efficient Block Adaptive Filter, IEEE Transactions on Acoustics, Speech, and Signal Processing, vol. ASSP-34, No. 6, (Dec. 1986).

J. Chao, H. Perez, and S. Tsujii, A Fast Adaptive Filter Algorithm Using Elgenvalue Reciprocals as Stepsizes, IEEE Transactions on Acoustics, Speech, and Signal Processing, vol. ASSP-38, No. 8, (Aug. 1990).

S.J. Elliot and B. Fafaely, Rapid Frequency-Domain Adaptation of Causal FIR Filters, IEEE Signal Processing Letters, vol. 4, No. 12, (Dec. 1997).

R.M. Gray, On the Asymptotic Elgenvalue Distribution of Toeplitz Matrices, IEEE Transactions on Information Theory, vol. IT-18, No.6, (Nov. 1972).

M. Johansson and L. Sundstorm, Linearization of RF Multicarrier Amplifiers using Cartesian Feedback, Electronic Letters, vol. 30, No. 14, (Jul. 7, 1994).

Hau et al. "Design and characterization of a microwave fee-forward amplifier with Improved wide-band distortion cancellation" IEEE Transactions on Microwave Theory and Techniques, vol. 49, issue 1, Jan. 2001, pp. 200-203.

* cited by examiner

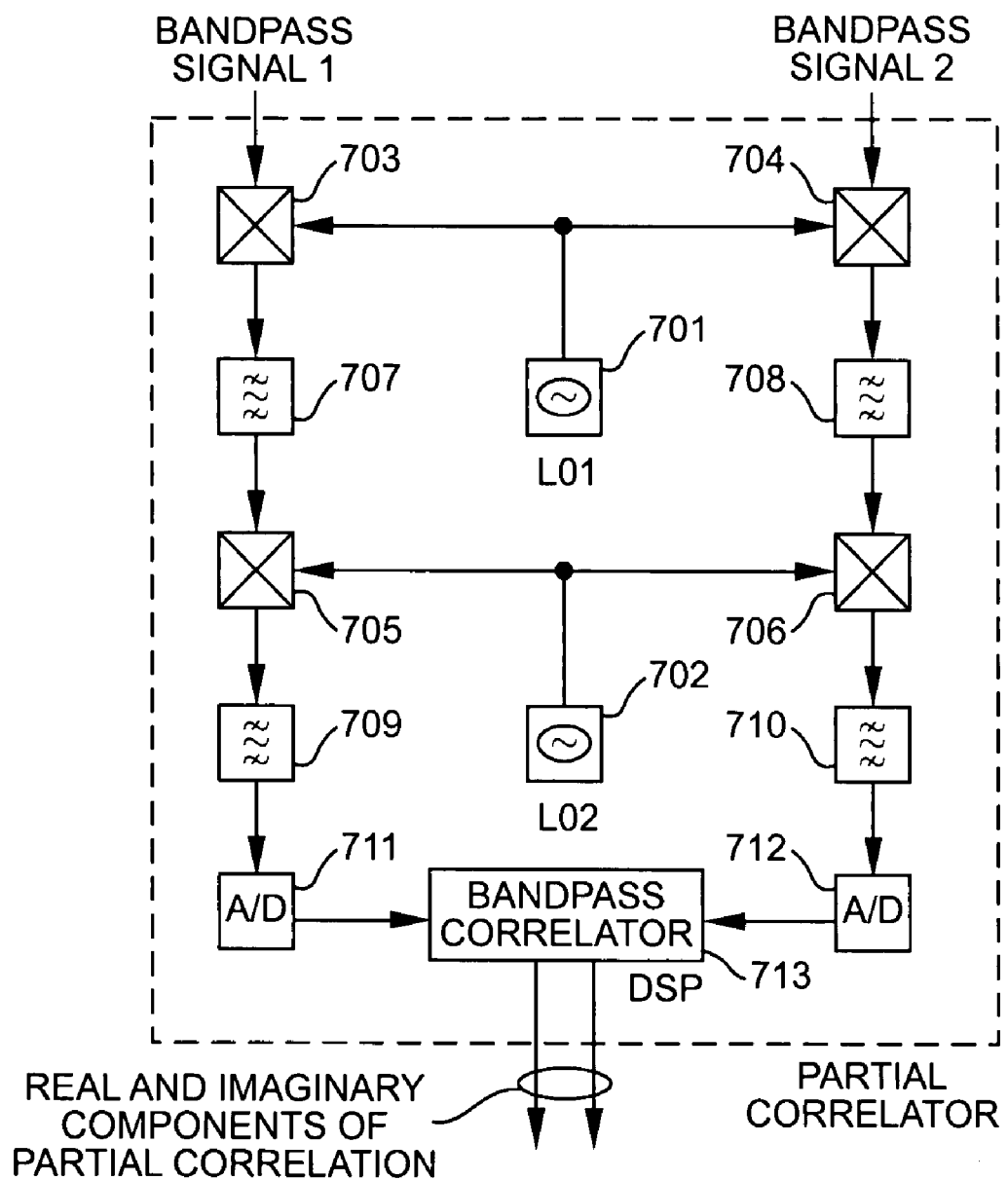

DECORRELATED POWER AMPLIFIER LINEARIZERS

CROSS-REFERENCE TO RELATED APPLICATIONS

This application is a division of application Ser. No. 09/982,626, filed on Oct. 18, 2001 is now a U.S. Pat. No. 7,015,751, which claims priority to U.S. Patent Application No. 60/301,978, filed Jun. 28, 2001, the entire disclosure of each application being incorporated herein by reference.

FIELD OF THE INVENTION

This application generally pertains to, but is not limited to, linearizers used in power amplifiers, for example, RF power amplifiers used in wireless communication systems.

BACKGROUND OF THE INVENTION

Modern wireless systems require both wide bandwidth and high linearity in the radio power amplifiers, a difficult combination to achieve. To date, the most successful architecture to correct for the nonlinearity in the power amplifier has been feedforward linearization. For many applications, its drawbacks in power efficiency are more than made up in linearity and bandwidth.

A generic feedforward linearizer for a power amplifier is shown in FIG. 1. The relationship of the output to the input of the circuits labeled "signal adjuster" (109, 110, 111) depends on the settings of one or more control parameters of these circuits. The signal adjuster circuits do not necessarily all have the same structure, nor are they all necessarily present in an implementation. Usually, only one of signal adjusters a 110 and c 109 are present. An "adaptation controller" 114 monitors the internal signals of the signal adjuster circuits, as well as other signals in the linearizer. On the basis of the monitored signal values and the relationships among those monitored signals, the adaptation controller 114 sets the Values of the signal adjuster control parameters. In FIG. 1, a stroke on an arrow denotes a multiplicity of monitor signals or a multiplicity of control settings that set the control parameter values. As will be appreciated by those skilled in the art, the elements shown as pickoff points, adders or subtractors may be implemented by directional couplers, splitters or combiners, as appropriate.

Signal adjuster circuits form adjustable linear combinations of filters. A typical internal structure is shown in FIG. 2a for signal adjuster a 110. The input signal is split into one or more branches, M in total, each of which has a different linear filter $H_{aj}(f)$, j=1 ... M (200, 202, 204). The output of each filter is weighted by a complex coefficient (i.e., magnitude and phase, or sine and cosine) in a complex gain adjuster (CGA 201, 203, 205), and the weighted outputs are summed by combiner 206 to form the output signal of the signal adjuster. In prior art signal adjuster circuits, the filters are simple delays, as shown in FIG. 2b, causing the signal adjuster to act as a finite impulse response (FIR) filter at RF, with possibly irregular spacing in time.

However, other filter choices are possible, including bandpass filters and bandstop filters. In general, the filters may be nonlinear in signal amplitude and may be frequency dependent. Examples include, without limitation, a cubic or Bessel function nonlinearity with intended or inadvertent nonlinearity, a bandpass filter with cubic dependence on signal amplitude, etc. (The mention in this Background Section of the use of these other filters in signal adjusters, however, is not intended to imply that this use is known in the prior art. Rather, the use of these other filters in signal adjusters is intended to be within the scope of the present invention.)

The CGAs themselves may have various implementation structures, two of which are shown in FIG. 3A and FIG. 3B. The implementation shown in FIG. 3A uses polar control parameters GA and GB, where GA sets the amplitude of the attenuator 301, while GB sets the phase of the phase shifter 302, which respectively attenuate and phase shift the RF input signal I to produce the RF output signal O. The implementation shown in FIG. 3B uses Cartesian control parameters, also designated GA and GB, where GA sets the real part of the complex gain, while GB sets the imaginary part of the complex gain. In this implementation, the RF input signal I is split into two signals by splitter 306, one of which is phase shifted by 90 degrees by phase shifter 303, while the other is not. After GA and GB are respectively applied by mixers or attenuators 305 and 304, the resulting signals are added by combiner 307 to produce the RF output signal O. As disclosed in U.S. Pat. No. 6,208,207, the complex gain adjusters may themselves be linearized so that any desired setting may be obtained predictably by an appropriate setting of control voltages.

The operation of a multibranch feedforward linearizer resembles that of single branch structures. With reference to FIG. 1, assume for simplicity's sake that signal adjuster c 109 is absent, that is, the RF input signal is directly input to the power amplifier 103. Within the signal cancellation circuit 101, appropriate setting of the CGA gains in signal adjuster a 110 allow it to mimic the desired linear portion of the power amplifier response, including the effects of amplifier delay and other filtering, and to compensate for linear impairments of its own internal structure. The unwanted components of the power amplifier output, such as nonlinear distortion, thermal noise and linear distortion are thereby revealed at the output of the first subtractor 106. Within the distortion cancellation circuit 102, appropriate setting of the parameters of the signal adjuster b 111 allows it to compensate for delay and other filtering effects in the amplifier output path and in its own internal structure, and to subtract a replica of the unwanted components from the amplifier output delayed by delay 112. Consequently, the output of the second subtractor 107 contains only the desired linear components of the amplifier output, and the overall feedforward circuit acts as a linear amplifier. Optional delay 104 is not used in this configuration.

It is also possible to operate with signal adjuster c, and replace signal adjuster a 110 with a delay 104 in the lower branch of the signal cancellation circuit 101, which delays the input signal prior to subtractor 106. The advantage of this configuration is that any nonlinear distortion generated in signal adjuster c 109 is cancelled along with distortion generated in the power amplifiers.

Generally, one- and two-branch signal adjusters are known in the art (see, for example, U.S. Pat. No. 5,489,875, which is incorporated herein by reference), as well as three-or-more branch signal adjusters (see, for example, U.S. Pat. No. 6,208,207, which is also incorporated by reference).

Other types of linearizers use only a predistortion adjuster circuit c. As will be appreciated by those skilled in the art, in this linearizer the signal adjuster circuit a is merely a delay line ideally matching the total delay of the adjuster circuit c and the power amplifier. In this case, the distortion cancellation circuit, comprising the distortion adjuster circuit b, the error amplifier and the delay circuit, is not used—the output of the linearizer is the simply the output of the signal power amplifier. The goal of the adjuster circuit c is to predistort the power amplifier input signal so that the power amplifier output signal is proportional to the input signal of the linearizer. That is, the predistorter acts as a filter having a transfer characteristic which is the inverse of that of the power amplifier, except for a complex constant (i.e., a constant gain and phase). Because of their serial configuration, the resultant transfer characteristic of the predistorter and the power amplifier is, ideally, a constant gain and phase that depends on neither frequency nor signal level. Consequently, the output signal will be the input signal amplified by the constant gain and out of phase by a constant amount, that is, linear. Therefore, to implement such predistortion linearizers, the transfer characteristic of the power amplifier is computed and a predistortion filter having the inverse of that transfer characteristic is constructed. Preferably, the predistortion filter should also compensate for changes in the transfer function of the power amplifier, such as those caused by degraded power amplifier components.

For example, a three-branch adaptive polynomial predistortion adjuster circuit c 109 is shown in FIG. 8. The upper branch 800 is linear, while the middle branch has a nonlinear cubic polynomial filter 801 and the lower branch has a nonlinear quintic polynomial filter 802, the implementation of which nonlinear filters is well known to those skilled in the art. Each branch also has a CGA, respectively 803, 804, and 805, to adjust the amplitude and phase of the signal as it passes therethrough. By setting the parameters (GA, GB) of each of the CGAs, a polynomial relationship between the input and output of the adjuster circuit can be established to compensate for a memoryless nonlinearity in the power amplifier. The adaptation controller, via a known adaptation algorithm, uses the input signal, the output of the nonlinear cubic polynomial filter, the output of the nonlinear quintic polynomial filter, and the error signal (the power amplifier output signal minus an appropriately delayed version of input signal) to generate the parameters (GA, GB) for the three CGAs.

Generally, the adaptation algorithm, whether to generate the control parameters for the CGAs of an analog predistorter linearizer or a feedforward linearizer, is selected to minimize a certain parameter related to the error signal (for example, its power over a predetermined time interval). Examples of such adaptation algorithms are known in the art, such as the stochastic gradient, partial gradient, and power minimization methods described in U.S. Pat. No. 5,489,875.

For example, FIG. 6a shows an adaptation controller using the stochastic gradient algorithm. For generating the control signals (GA, GB) for the CGAs of adjuster circuit a 110, the bandpass correlator 606 correlates the error signal at the output of subtractor 106 with each of the monitor signals output from the adjuster circuit a 110. The controller integrates the result using integrator 608, via loop gain amplifier 607, to generate CGA control signals (GA, GB). The internal structure of a bandpass correlator 606 that estimates the correlation between the complex envelopes of two bandpass signals is shown in FIG. 6b. The bandpass correlator includes a phase shifter 601, mixers 602 and 603, and bandpass filters (or integrators) 604 and 605. The operation of this bandpass correlator is described in U.S. Pat. No. 5,489,875 in FIG. 3 thereof and its corresponding text. By use of a controllable RF switch at its inputs, a hardware implementation of a bandpass correlator can be connected to different points in the circuit, thereby allowing bandpass correlations on various pairs of signals to be measured by a single bandpass correlator.

U.S. Pat. No. 5,489,875 also discloses an adaptation controller using a "partial gradient" adaptation algorithm by which the correlation between two bandpass signals is approximated as a sum of partial correlations taken over limited bandwidths at selected frequencies. This provides two distinct benefits: first, the use of a limited bandwidth allows the use of a digital signal processor (DSP) to perform the correlation, thereby eliminating the DC offset that appears in the output of a correlation implemented by directly mixing two bandpass signals; and second, making the frequencies selectable allows calculation of correlations at frequencies that do, or do not, contain strong signals, as desired, so that the masking effect of strong signals on weak correlations can be avoided. FIG. 7, adapted from FIG. 9 of U.S. Pat. No. 5,489,875, illustrates a partial correlator, in which local oscillators 701 and 702 select the frequency of the partial correlation. Frequency shifting and bandpass filtering are performed by the mixer/bandpass filter combinations 703/707, 704/708, 705/709, 706/710. The signals output by the bandpass filters 709 and 710 are digitally converted, respectively, by analog-to-digital converters (ADCs) 711 and 712. Those digital signals are bandpass correlated by DSP 713 to produce the real and imaginary components of the partial correlation. The partial correlator is illustrated for two stages of analog downconversion, but more or fewer stages may be required, depending on the application. (See, for example, FIG. 9 of U.S. Pat. No. 5,489,875 and its accompanying text for a description of the operation of such partial correlators.)

Multibranch signal adjusters allow for the amplification of much wider bandwidth signals than could be achieved with single branch adjusters, since the former provides for adaptive delay matching. Further, multibranch signal adjusters can provide intermodulation (IM) suppression with multiple nulls, instead of the single null obtainable with single-branch adjusters. FIG. 4, for example, shows two nulls produced with a two-branch signal adjuster circuit. This property of multibranch signal adjusters further supports wide signal bandwidth capability. The two- and three-branch FIR signal adjusters respectively disclosed by U.S. Pat. Nos. 5,489,875 and 6,208,207 can also compensate for frequency dependence of their own components, as well as delay mismatch. However, despite the above features, there is still a need for techniques to improve the reliability of the adaptation of multibranch feedforward linearizers.

One such desirable technique is to decorrelate the branch signals monitored by the adaptation controller. This can be appreciated from consideration of a two-branch FIR signal adjuster, as depicted in FIG. 2B (M=2). The difference in delays between the two branches is relatively small compared with the time scale of the modulation of the RF carrier. Consequently, the two signals are very similar, tending to vary almost in unison. Adaptive adjustment of the CGA gains by known stochastic gradient or power minimization techniques will cause the two gains also to vary almost in unison. However, it is the difference between the gains that produces the required two nulls, instead of one, in the frequency response; and because the difference between the signals is so small, the difference of CGA gains is unacceptably slow to adapt.

It is known in the art that decorrelation of equal power branch signals of a two-branch FIR signal adjuster has the potential to greatly speed adaptation. Specifically, U.S. Pat. No. 5,489,875 discloses a circuit structure that decorrelates the branch signals of a two-branch FIR signal adjuster to the sum and the difference of the two complex envelopes ("common mode" and "differential mode", respectively) for separate adaptation. This circuit takes advantage of the special property that when there is equal power in the branches of the two-branch FIR signal adjuster, the common mode and the differential mode correspond to the eigenvectors of the correlation matrix of the two complex envelopes. Consequently, the common mode and differential mode are uncorrelated, irrespective of the degree of correlation of the original branch signals. Accordingly, use of the sum and difference signals, instead of the original signals, separates the common and differential modes, thereby allowing, for example, adaptation by the stochastic gradient method to give more emphasis, or gain, to the weak differential mode. This in turn allows the signal adjuster to converge, and form the dual frequency nulls, as quickly as the common mode.

In all other linearizers, however, the linear combinations of branch signals which comprise the uncorrelated modes are not readily determinable in advance. The coefficients for such combinations depend on the relative delays (or filter frequency responses) of the branches and on the input signal statistics (autocorrelation function or power spectrum). Accordingly, for these other linearizers, the adaptation controller must determine the uncorrelated modes and adjust their relative speeds of convergence.

Another technique desired to improve the reliable operation of multibranch feedforward linearizers is self-calibration. The need for it can be understood from the fact that the monitored signals, as measured by the adaptation controller 114 in FIG. 1, are not necessarily equal to their counterpart internal signals within the signal adjuster blocks and elsewhere. The reason is that the cables and other components of the signal paths that convey the internal signals of the adjuster blocks to the adaptation controller introduce inadvertent phase and amplitude changes. The true situation for an M-branch signal adjuster is represented in FIG. 5, where these changes are represented by "observation filters" $H_{am1}$(f) to $H_{amM}$(f) (501, 502, 503) that transform the internal signals $v_{a1} \ldots v_{aM}$ before they appear as monitor signals $v_{am1} \ldots v_{amM}$ at the adaptation controller. In the simplest case, the observation filters and filter networks consist of frequency-independent amplitude and phase changes on each of the signal paths. The responses of the observation filters are initially unknown. Observation filters have been omitted for signals $v_{in}$ and $v_e$ because, without loss of generality, their effects can be included in the illustrated branch filters and observation filters. Although FIG. 5 illustrates only signal adjuster a 110, a similar problem is associated with signal adjusters b 111 and c 109.

The presence of unknown observation filters causes two related problems. First, although adaptation methods based on correlations, such as stochastic gradient, attempt to make changes to CGA gains in directions and amounts that maximally reduce the power in the error signal, the observation filters introduce phase and amplitude shifts. In the worst case of a 180-degree shift, the adaptation adjustments maximally increase the error signal power—that is, they cause instability and divergence. Phase shifts in the range of −90 degrees to +90 degrees do not necessarily cause instability, but they substantially slow the convergence if they are not close to zero. The second problem is that it is difficult to transform the branch signals to uncorrelated modes if their monitored counterparts do not have a known relationship to them.

Determination of the observation filter responses, and subsequent adjustment of the monitor signals in accordance therewith, is termed calibration. Procedures for calibration (i.e., self-calibration) remove the need for manual calibration during production runs and remove concerns that subsequent aging and temperature changes may cause the calibration to be in error and the adaptation to be jeopardized.

SUMMARY OF THE INVENTION

To overcome the above-described shortcomings in the prior art, procedures for decorrelating the branch signals of a signal adjuster of an amplifier linearizer are presented below. The decorrelation procedures can be performed with or without self-calibration. These and other aspects of the invention may be ascertained from the detailed description of the preferred embodiments set forth below, taken in conjunction with one or more of the following drawings.

BRIEF DESCRIPTION OF THE DRAWINGS

FIG. 7 is a block diagram of a partial correlator.

DETAILED DESCRIPTION OF THE PREFERRED EMBODIMENTS

The present invention includes procedures by which the branch signals $v_{a1}$ to $v_{aM}$ of a multibranch signal adjuster may be decorrelated for any number of branches. These procedures apply to signal adjuster in which the branch signals have equal or unequal power. Decorrelating the branch signals in the adaptation process provides faster convergence than not decorrelating. The present invention also includes procedures for both self-calibrating and decorrelating an uncalibrated signal adjuster.

Accordingly, there are two classes of linearizers. In the first linearizer class, calibration is unnecessary or has already been achieved, and thus only decorrelation is performed. In the second linearizer class, calibration is desired, and thus self-calibration and decorrelation are performed integrally. These two linearizer classes will be addressed in that order.

First Linearizer Class

Figure 1:
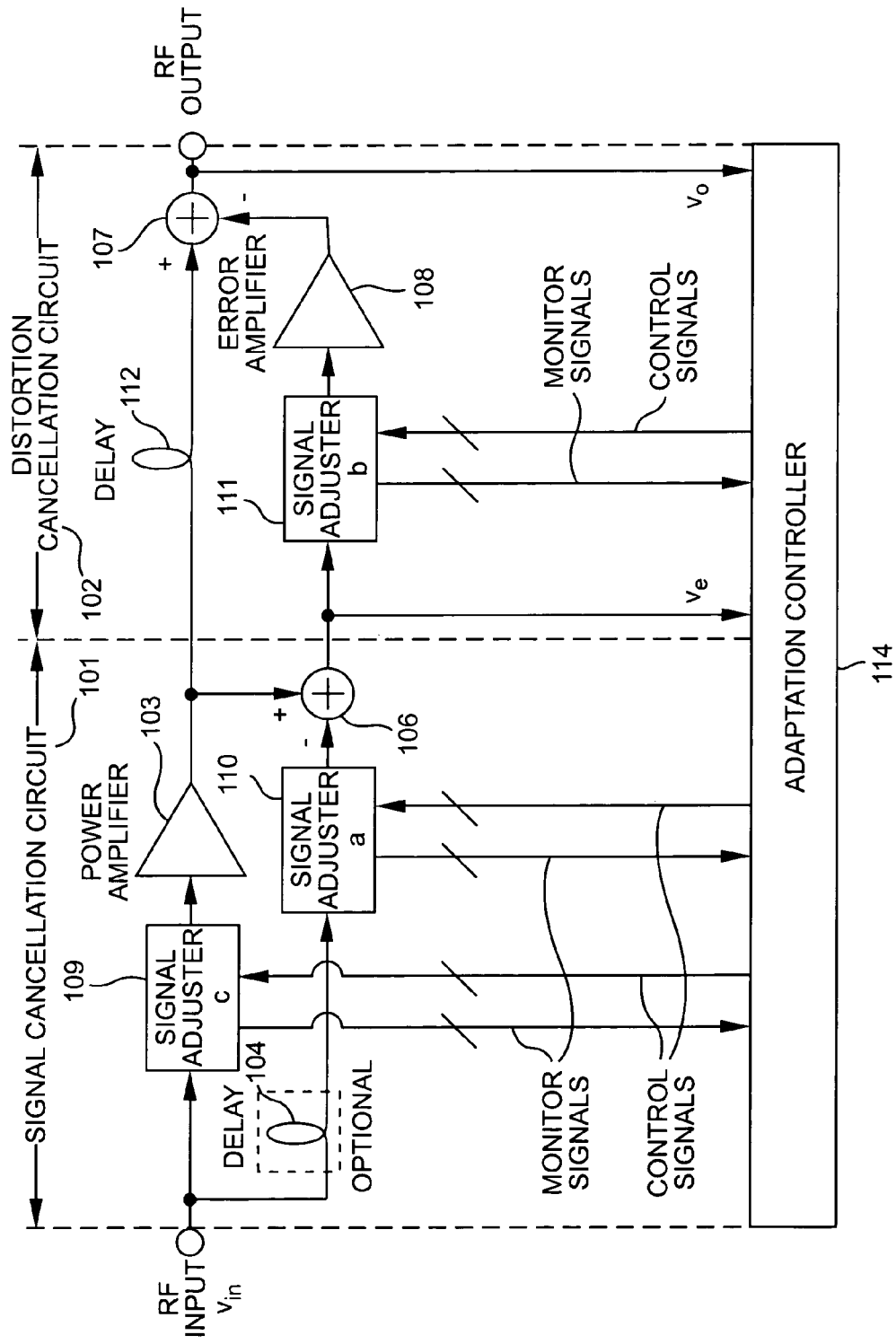
FIG. 1 is a block diagram of a generic architecture for a feedforward linearizer.
Figure 2A:
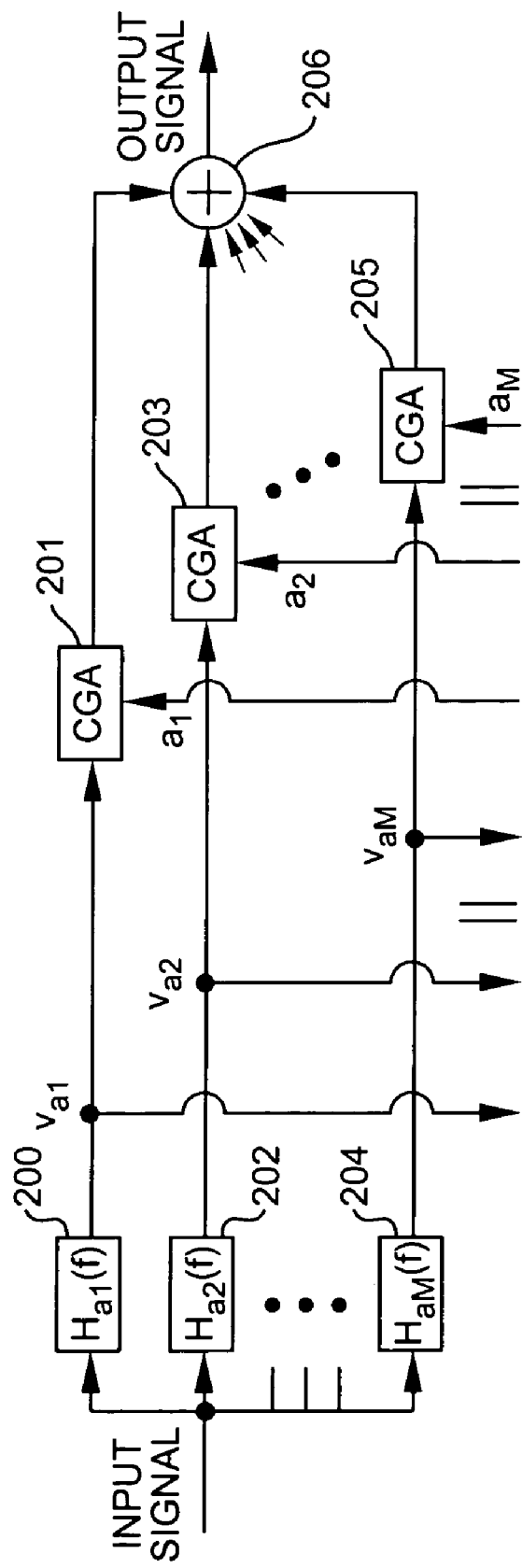
FIGS. 2a and 2b respectively are general structures of a signal adjuster circuit and an FIR signal adjuster.
Figure 2B:
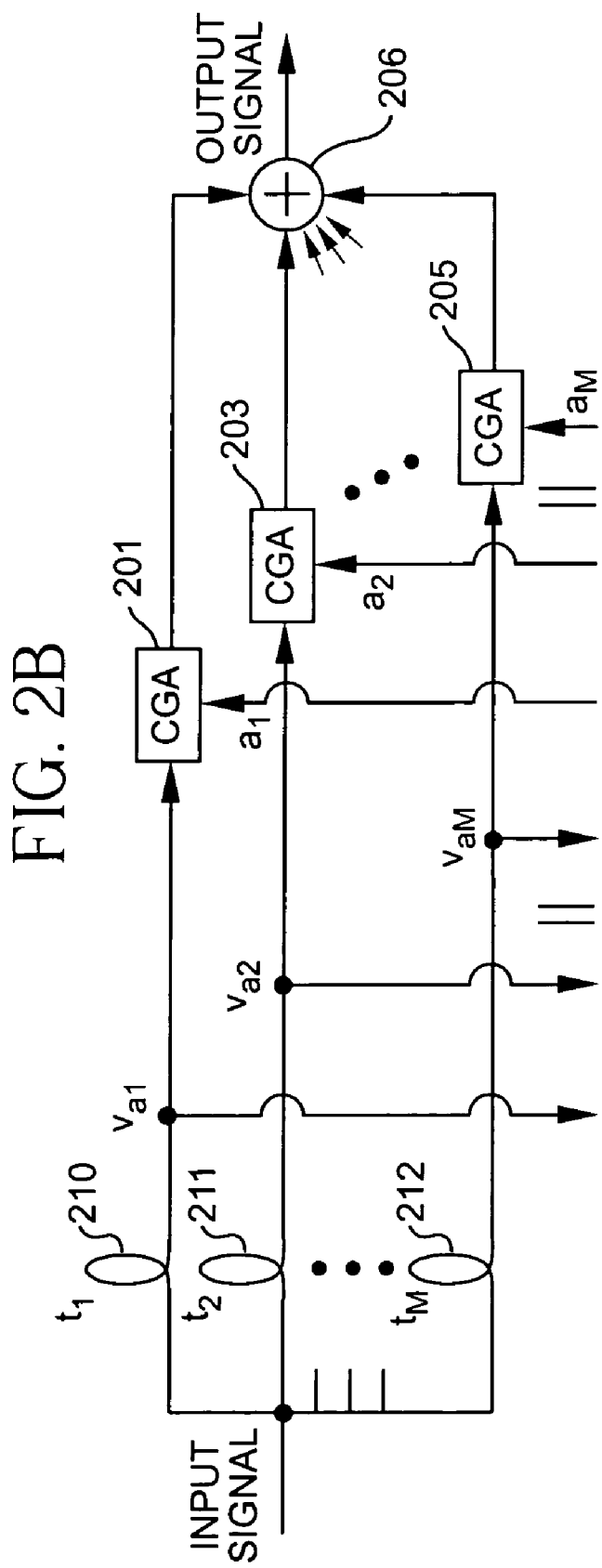
Figure 3A:
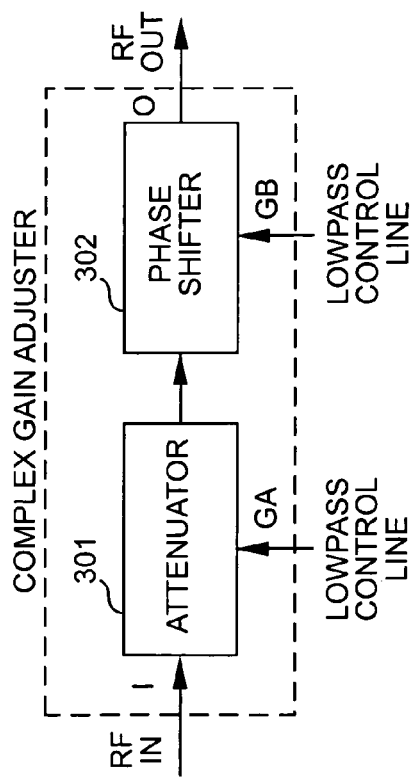
FIGS. 3a and 3b respectively show two configurations of a complex gain adjuster.
Figure 3B:
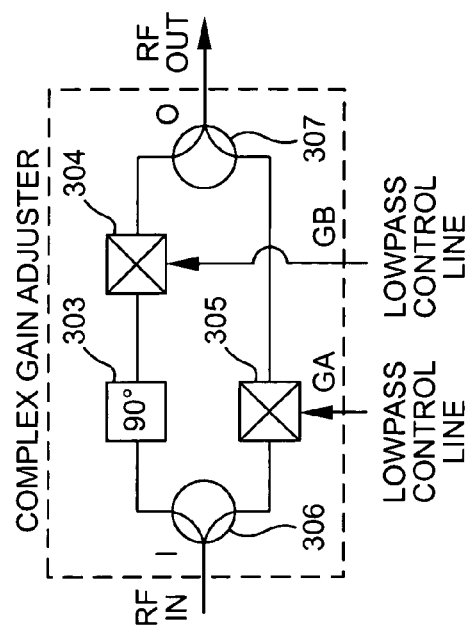
Figure 4:
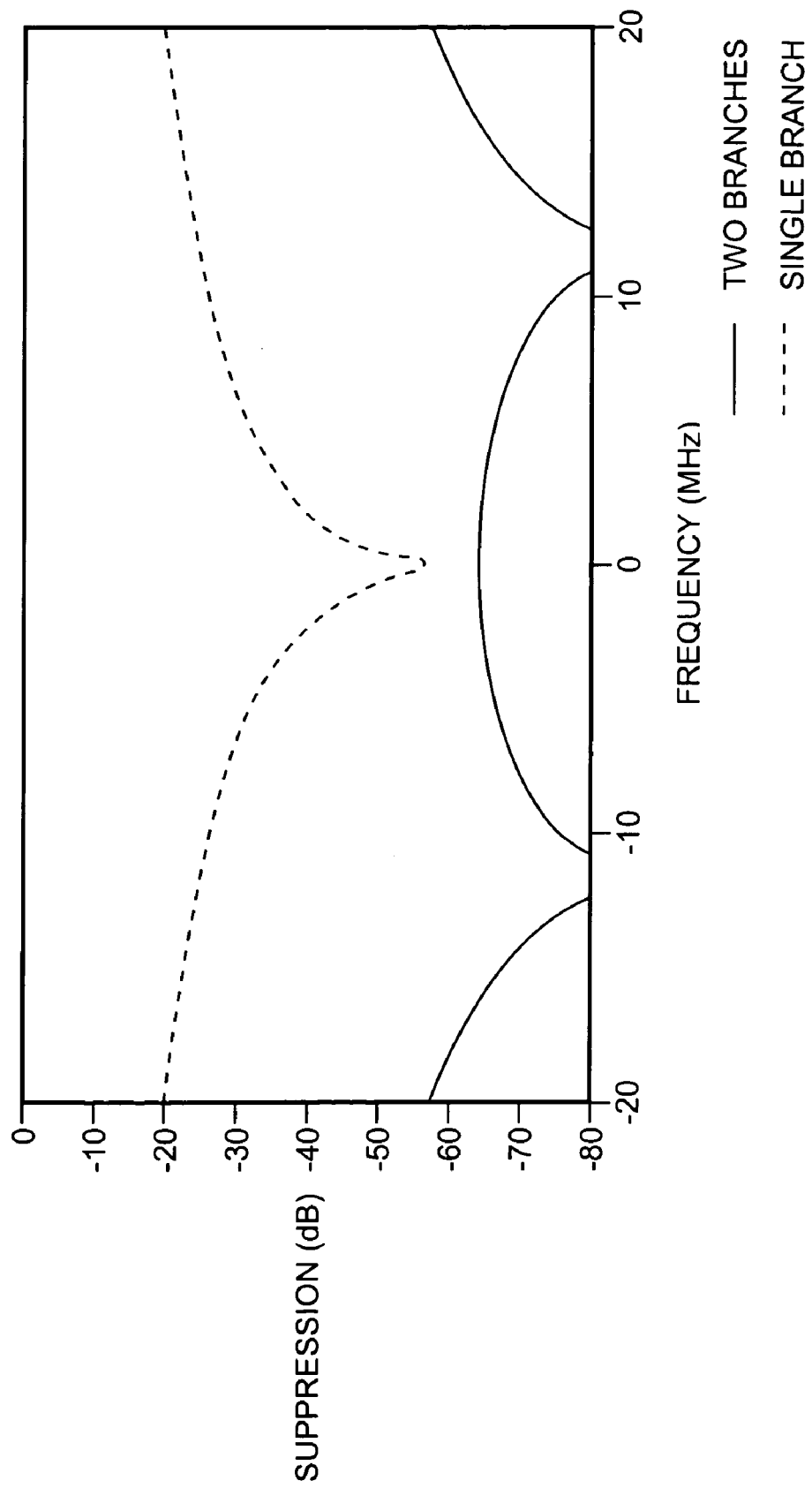
FIG. 4 shows the reduction of IM power across the band for a one-branch and two-branch signal adjuster.
Figure 5:
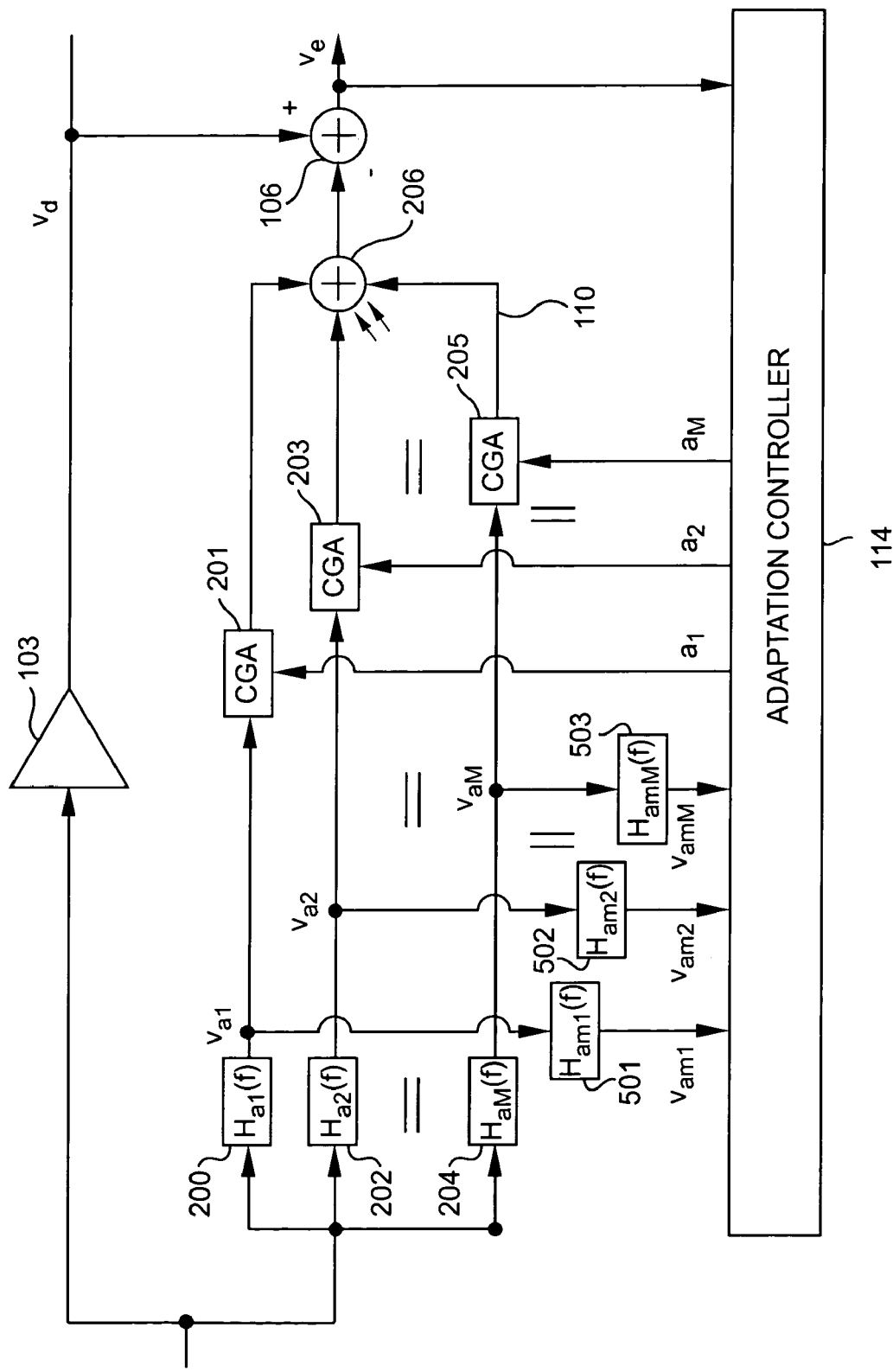
FIG. 5 is a block diagram of a signal adjuster circuit with observation filters.

If calibration is unnecessary, or has already been achieved, there are no calibration errors to account for. That is, the respective responses of the observation filters 501–503 of the linearizer shown in FIG. 5 are unit gains. Therefore, with respect to signal adjuster a 110, the monitored signals $v_{am1} \ldots v_{amM}$ are equal to the internal branch signals $v_{a1} \ldots v_{am}$. This equality between the internal and monitored branch signals also applies to signal adjusters b 111 and c 109.

Within this first linearizer class, consider the case in which the adaptation controller attempts to minimize the total power $P_e$ of the error signal $v_e = v_d - a_1 v_{a1} - a_2 v_{a2} - \ldots - a_M v_{aM}$, where $v_d$ is the amplifier output, with respect to the control settings $a_1, a_2, \ldots, a_M$ of signal adjuster a. One known adaptation algorithm to minimize the power of the error signal is least mean squares (LMS). In vector form, iteration n+1 of the CGA control settings can be expressed in terms of its iterations-n value as $$a(n+1) = a(n) + u r_{ae}(n) \quad (1)$$

where the CGA control settings are $a(n) = [a_1(n), a_2(n), \ldots, a_M(n)]^T$, u is a scalar step size parameter and $r_{ae}(n)$ is the iteration-n correlation vector with the $j^{th}$ component thereof equal to corr $(v_e, v_{aj})$ the bandpass correlation of the error signal and the branch-j signal of signal adjuster a, and j ranges from 1 to M.

Figure 6A:
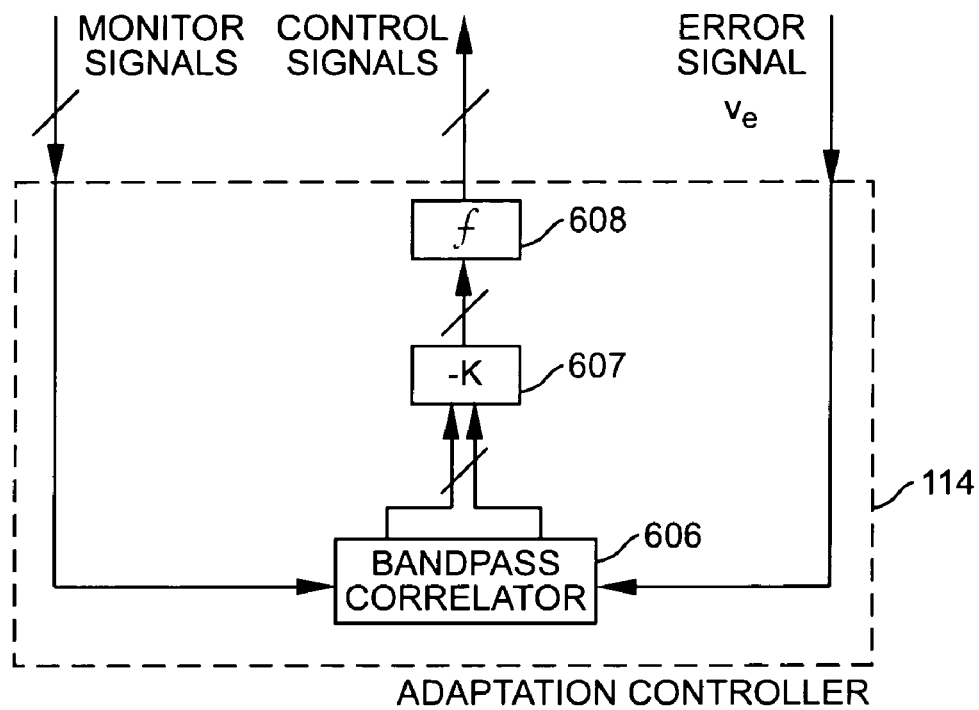
FIGS. 6a and 6b respectively are block diagrams of an adaptation controller using a bandpass filter, and the bandpass filter.
Figure 6B:
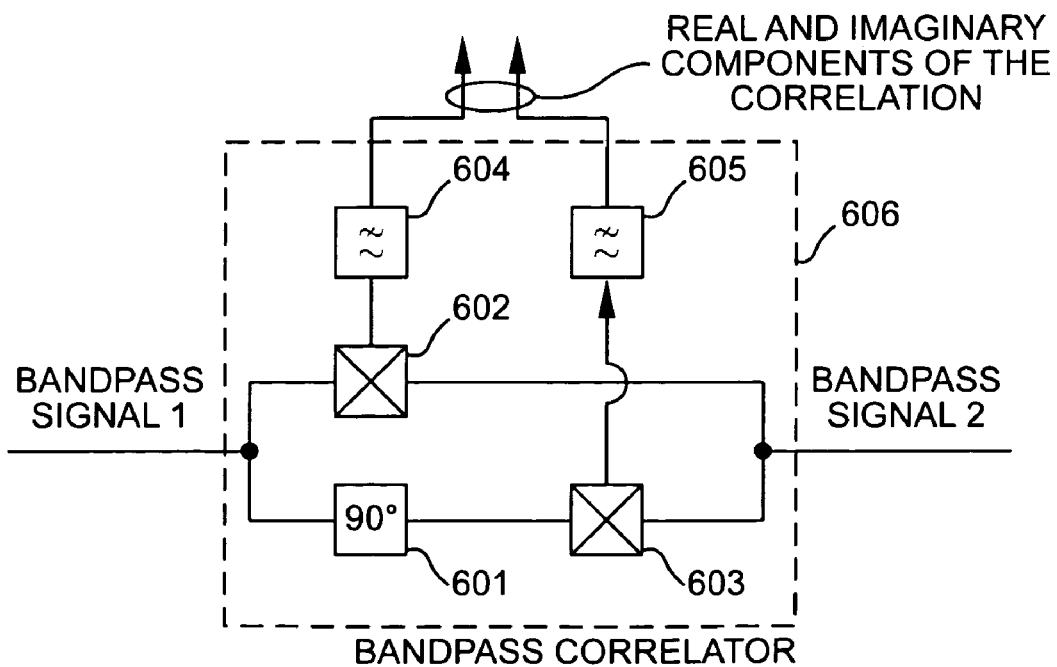

In general, for LMS algorithms, convergence speed is determined by the signal correlation matrix $R_a$, which has j,k element equal to the bandpass correlation corr($v_{aj}, v_{ak}$) of branch j and branch k signals, where j and k range from 1 to M and bandpass correlation is illustrated in FIG. 6b. The greater the ratio of maximum to minimum eigenvalues of $R_a$, the slower the convergence. Further, $R_a$ is normally not a diagonal matrix because the branch signals are correlated. Consequently the correlation vector $r_{ae}(n)$ has correlated components, causing the components of a(n) to be coupled in their adaptation.

In addition, LMS algorithms can be made to converge more quickly by use of the eigenvector matrix $Q = [q_1, q_2, \ldots, q_M]$, where the columns $q_j$ are the eigenvectors of $R_a$. Multiplication of equation (1) by Q gives the transformed adaptation $$Q^H a(n+1) = Q^H a(n) + u Q^H r_{ae}(n) \quad (2)$$

where superscript H denotes conjugate transpose. The components of $Q^H r_{ae}(n)$ are uncorrelated, which gives the components of a uncoupled, or uncorrelated, adaptations. This further allows the uncoupled adaptations to have individual step size parameter values $u_1, u_2, \ldots, u_M$, so that originally slow modes can be given much greater adaptation speed through increase of their step size parameters. Multiplying equation (2) by Q gives the modified adaptation $$a(n+1) = a(n) + QUQ^H r_{ae}(n) \quad (3)$$

where U is the diagonal matrix of step size parameters $U = \text{diag } [u_1, u_2, \ldots, u_M]$.

In addition, the step size parameters may be optimally chosen to be proportional to the reciprocals of the corresponding eigenvalues of $R_a$. Rewriting the adaptation equation (3) with such optimal step size parameters gives $$a(n+1) = a(n) + s R_a^{-1} r_{ae}(n) \quad (4)$$

where s is a scalar step size parameter and $R_a^{-1}$ is the inverse of $R_a$.

As stated in the Background section, the prior art only discloses decorrelation for an FIR signal adjuster with two branches carrying signals of equal power. Only for this signal adjuster is $R_a$ known in advance. Its columns are proportional to $[+1,+1]^T$ and $[+1,-1]^T$; that is, it forms the common mode and the differential mode.

For all other signal adjusters, $R_a$ depends on the signal correlations and the filters and is normally not known in advance. These cases include, but are not limited to:

an FIR signal adjuster with two branches carrying unequal power;

signal adjusters having two or more branches, in which the branch filters are not FIR filters; and signal adjusters having three or more branches, with no limitations on the type of branch filter or on the branch power.

For these other signal adjusters, however, equation (4) can be approximated closely by the following steps:

(a) perform bandpass correlations between all pairs of the monitor signals $v_{a1} \ldots v_{aM}$; the resulting measured correlations are components of matrix $R_a$;

(b) invert $R_a$ to form $R_a^{-1}$ for use in the subsequent adaptation (4);

(c) at each stage of the iteration, perform the bandpass correlations between the error signal and the monitored branch signals; the resulting measured correlations are components of the correlation vector $r_{ae}(n)$.

Variations are possible, such as measuring the components of matrix $R_a$ from time to time as conditions change, such as power level changes or adding and dropping of carriers in a multicarrier system.

Other approaches, explicit or implit, to decorrelation are also possible, and, in their application to feedforward linearizers or analog predistortion linearizers, they fall within the scope of the invention. Examples include a least squares solution that first measures $r_{ad}$, the vector of bandpass correlations of the amplifier output signal $v_d$ and the branch signals $v_{a1} \ldots v_{aM}$ of signal adjuster a, and measures $R_a$ as described above, then selects the vector of CGA control settings to be $a = R_a^{-1} r_{ad}$. The least squares solution may also be implemented iteratively, where $R_a$ is a weighted average of measured correlation matrices $R_a(n)$ at successive iterations n=1, 2, 3, ... and $r_{ad}$ is a weighted average of measured correlation vectors $r_{ad}(n)$ at successive iterations. It may also be implemented by means of a recursive least squares algorithm. Least squares and recursive least squares implicitly decorrelate the branch signals, so that convergence speed is unaffected by the ratio of eigenvalues of $R_a$.

Although this example has dealt with signal adjuster a 110, decorrelation can also be applied to adjusters b 111 and c 109, with similarly beneficial effects on convergence speed. Further, the adjusters need not all have the same number of branches.

To continue examples in the first linearizer class, consider adaptation that seeks to minimize the weighted sum of powers in the error signal $v_e$; specifically, those powers calculated in narrow spectral bands located at N selected frequencies $f_1, f_2, \ldots, f_N$. The quantity to be minimized is $$P'_e = \sum_{i=1}^{N} w_i P_e(f_i) \quad (5)$$

where $w_i$ is a positive real weight and $P_e(f_i)$ is the power in the $i^{th}$ narrow spectral band. The number N of such narrow spectral bands should be at least as great as the number M of signal adjuster branches. Compared to the example just discussed, in which adaptation seeks to minimize the total power of the error signal $v_e$, this example has the advantage of not requiring bandpass correlators to be accurate and bias-free over a wide bandwidth; instead, it employs partial correlators, which, as discussed above, may be implemented more accurately and flexibly. If the number of frequency bands equals the number of branches, the optimum choice of CGA control settings produces nulls, or near-nulls, in the power spectrum of $v_e$ at the frequencies $f_i$ and to relative depths depending on the choice of weights.

A stochastic gradient equation which causes the CGA control settings to converge to their optimum values is $$a(n+1)=a(n)+ur'_{ae}(n) \qquad (6)$$

where the modified correlation vector is $$r'_{ae}(n) = \sum_{i=1}^{N} w_i r_{ae}(n, f_i) \qquad (7)$$

In equation (7), $r_{ae}(n,f_i)$ is the vector at iteration n of partial correlations between the error signal $v_e$ and the branch signals $v_{aj}$, j=1 ... M when the partial correlators are set to select frequency $f_i$. Its $j_{th}$ component can be expressed as pcorr($v_e,v_{aj},f_i$), where the third parameter of pcorr indicates the selected frequency.

When the components of $r'_{ae}$ are correlated, adaptation speed is determined by the ratio of maximum to minimum eigenvalues of the modified signal correlation matrix $R'_a$ which has j,k element equal to the sum of partial correlations of branch j and branch k signals $$[R'_a]_{j,k} = \sum_{i=1}^{N} w_i pcorr(v_{aj}, v_{ak}, f_i) \qquad (8)$$

The adaptation (6) can be made significantly faster by modifying the iteration update to $$a(n+1)=a(n)+sR'_a{}^{-1}r'_{ae}(n) \qquad (9)$$

Equation (9) can be approximated closely by the following steps:
(a) perform partial correlations between all pairs of the monitor signals $v_{a1}$ ... $v_{aM}$ at all the selected frequencies $f_1,f_2, \ldots , f_N$; sums of the resulting measured correlations form components of matrix $R'_a$ as explained in (8);
(b) invert $R'_a$ to form $R'_a{}^{-1}$ for use in the subsequent adaptation (9);
(c) at each stage of the iteration, perform the partial correlations between the error signal and the monitored branch signals at all the selected frequencies $f_1, f_2, \ldots, f_N$; sums of the resulting measured correlations form components of the correlation vector $r'_{ae}(n)$ as described above.

Variations are possible, such as measuring the components of matrix $R'_a$ from time to time as conditions change, such as power level changes or adding and dropping of carriers in a multicarrier system.

Other approaches, explicit or implit, to decorrelation are also possible, and, in their application to feedforward amplifiers, they fall within the scope of the invention. Examples include a least squares solution that selects the vector of CGA control settings to be a $=R'_a{}^{-1}r'_{ad}$ (analogous to the approach for computing $a=R_a{}^{-1}r_{ad}$ described above) and its recursive least squares implementation.

Although this example has dealt with signal adjuster a 110, decorrelation can also be applied to adjusters b 111 and c 109, with similarly beneficial effects on convergence speed. The selected frequencies and the number of branches are not necessarily the same for different signal adjusters.

Second Linearizer Class

In another aspect of the present invention, calibration of the signal adjuster is desired, and thus self-calibration and decorrelation are performed integrally. The procedure for self-calibrating and decorrelating will be described for adaptation that seeks to minimize the weighted sum of powers in the error signal $v_e$ in N narrow spectral bands, as in equation (5). However, one skilled in the art will appreciate that this procedure may readily be extended to power minimization adaptation as set forth above. Specifically, adaptation to minimize the total power in $v_e$ can be obtained by setting N=1 and replacing partial correlation with bandpass correlation.

The self-calibration and decorrelation procedure for adaptation seeking to minimize the weighted sum of powers is as follows:
(1) initially, and from time to time as necessary, determine the gains of the observation filters $H_{amj}(f_i)$ for the M branches, j=1 ... M, and at the N selected frequencies $f_1,f_2, \ldots, f_N$, a process termed self-calibration and described further below;
(2) perform the adaptation iteration of equation (9), obtaining $R'_a$ and $r_{ae}$ by converting partial correlations involving the monitored branch signals to those using the internal branch signals by division by monitor filter gains. Thus, the jth component of $r_{ae}$ is given by $$[r'_{ae}]_j = \sum_{i=1}^{N} w_i pcorr(v_e, v_{amj}, f_i)/H_{amj}(f_i) \qquad (10)$$

and the j,k component of $R'_a$ is given by $$[R'_a]_{j,k} = \sum_{i=1}^{N} w_i pcorr(v_{amj}, v_{amk}, f_i)/(H^*_{amj}(f_i)H_{amk}(f_i)) \qquad (11)$$

As in the embodiments already described above, other algorithms that act, explicitly or implicitly, to decorrelate the branch signals fall within the scope of the invention. Signal adjusters b and c are treated similarly, although they may use a different selection of frequencies at which to perform partial correlations.

The observation filter gain $H_{amj}(f_i)$ of the branch-j observation filter at frequency $f_i$ in step (1) immediately above is determined by the adaptation controller by the following procedure:
(1) set the amplifier to standby mode, so that its output is zero;
(2) set the CGA gain $a_j$ to some nominal value $a'_j$ through appropriate choice of the control voltage; set all other CGA gains to zero through appropriate choice of the control voltage;
(3) use a partial correlator with local oscillators set to select frequency $f_i$, to produce the correlation of signal $v_e$ with monitor signal $v_{amj}$; the result is $C_{eamj}(f_i)=a'_j H^*{}_{amj}(f_i)P_{aj}(f_i)$, where $P_{aj}(f_i)$ denotes the power of signal $v_{aj}$ at frequency $f_i$;

(4) use a partial correlator, with local oscillators set to select frequency $f_i$, to produce the correlation of monitor signal $v_{amj}$ with itself; the result is $C_{amj}(f_i) = |H_{amj}(f_i)|^2 P_{aj}(f_i)$;

(5) estimate the observation filter gain at frequency $f_i$ as $H_{amj}(f_i) = a'_j C_{amj}(f_i) / C_{eamj}(f_i)$.

The gains on other branches and at other frequencies are determined similarly. Although this description considered only signal adjuster a 110, equivalent procedures allow calibration of signal adjusters b 111 and c 109.

In addition, for linearizers that minimize the total power of the error signal by bandpass correlation, as described above, the observation filter gains are independent of frequency. Accordingly, each observation filter gains may be computed by using a local oscillator set to frequency $f_1$ to produce a single tone for calibration, or by applying an input signal containing frequency components at $f_1$. A bandpass correlator is then used to produce the respective correlations of the error signal and the monitor signal, and of the monitor signal with itself, in similar fashion to steps (3) and (4) discussed immediately above. Those correlations are then used to determine the observation filter gain in similar fashion to step (5) discussed immediately above.

As will be apparent to those skilled in the art in light of the foregoing disclosure, many alterations and modifications are possible in the practice of this invention without departing from the spirit or scope thereof. For example, a may be defined as a control signal vector of M length, $R_a$ is an MxM signal correlation matrix computed as the weighted sum of measured signal correlation matrices $R_a(n)$ at successive iteration steps n=1, 2, 3, . . . , $R_a^{-1}$ is the inverse of the signal correlation matrix, and $r_{ae}$ is a correlation vector of M length computed as the weighted sum of measured correlation vectors $r_{ae}(n)$ at successive iteration steps. The control signal vector a may then be computed by least squares as $a = R_a^{-1} r_{ae}$. Alternative, a and $R_a^{-1}$ may be computed iteratively according to a recursive least squares method.

Figure 8:
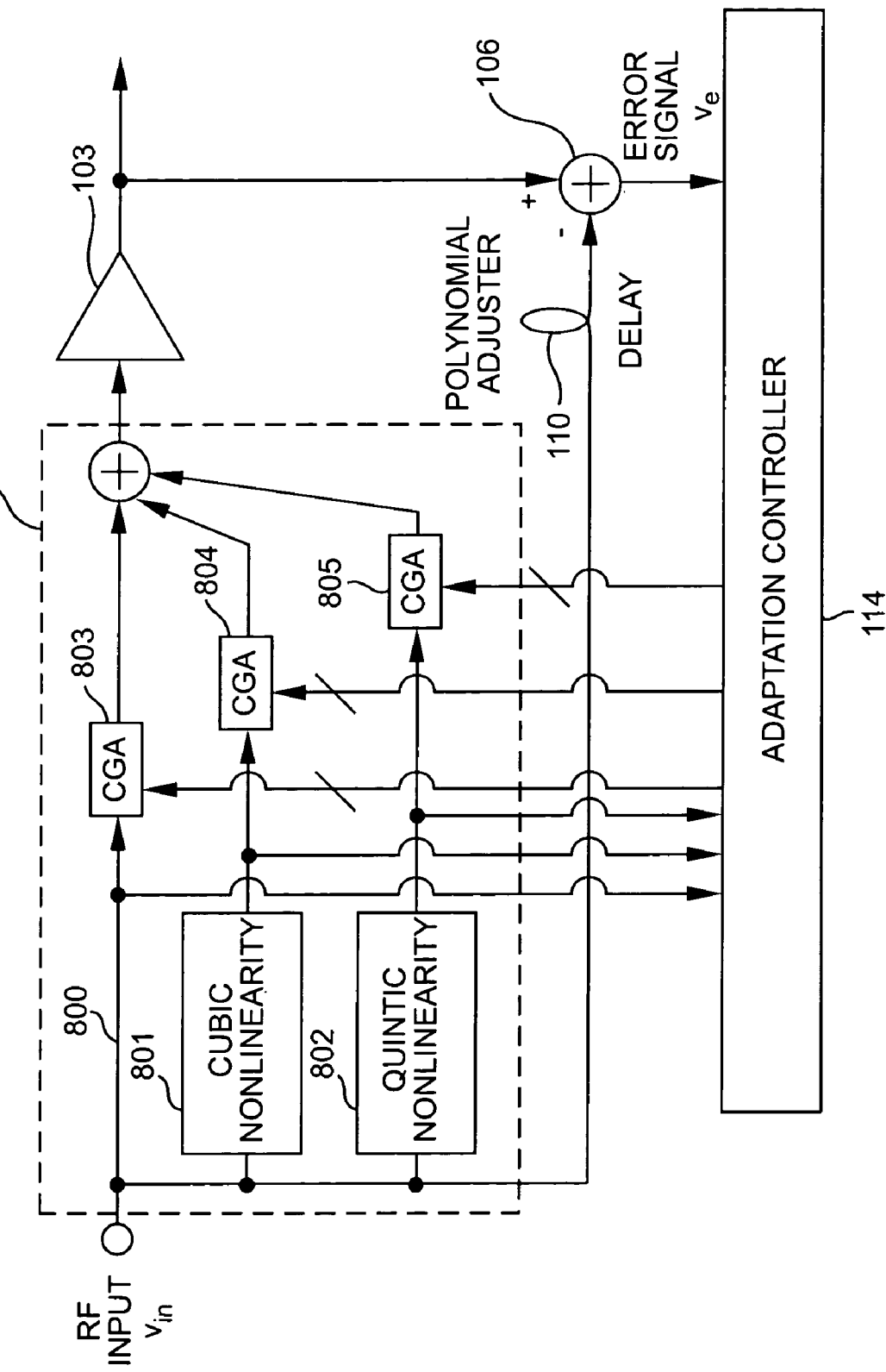
FIG. 8 is a block diagram of an analog predistorter circuit.

In addition, as will be appreciated by those skilled in the art, all of the above decorrelation and decorrelation/self-calibration procedures may be similarly applied to the branch signals of the analog predistorter described above and shown in FIG. 8, and to a general signal adjuster, in which the branch filters may be nonlinear and frequency dependent.

Figure 9:
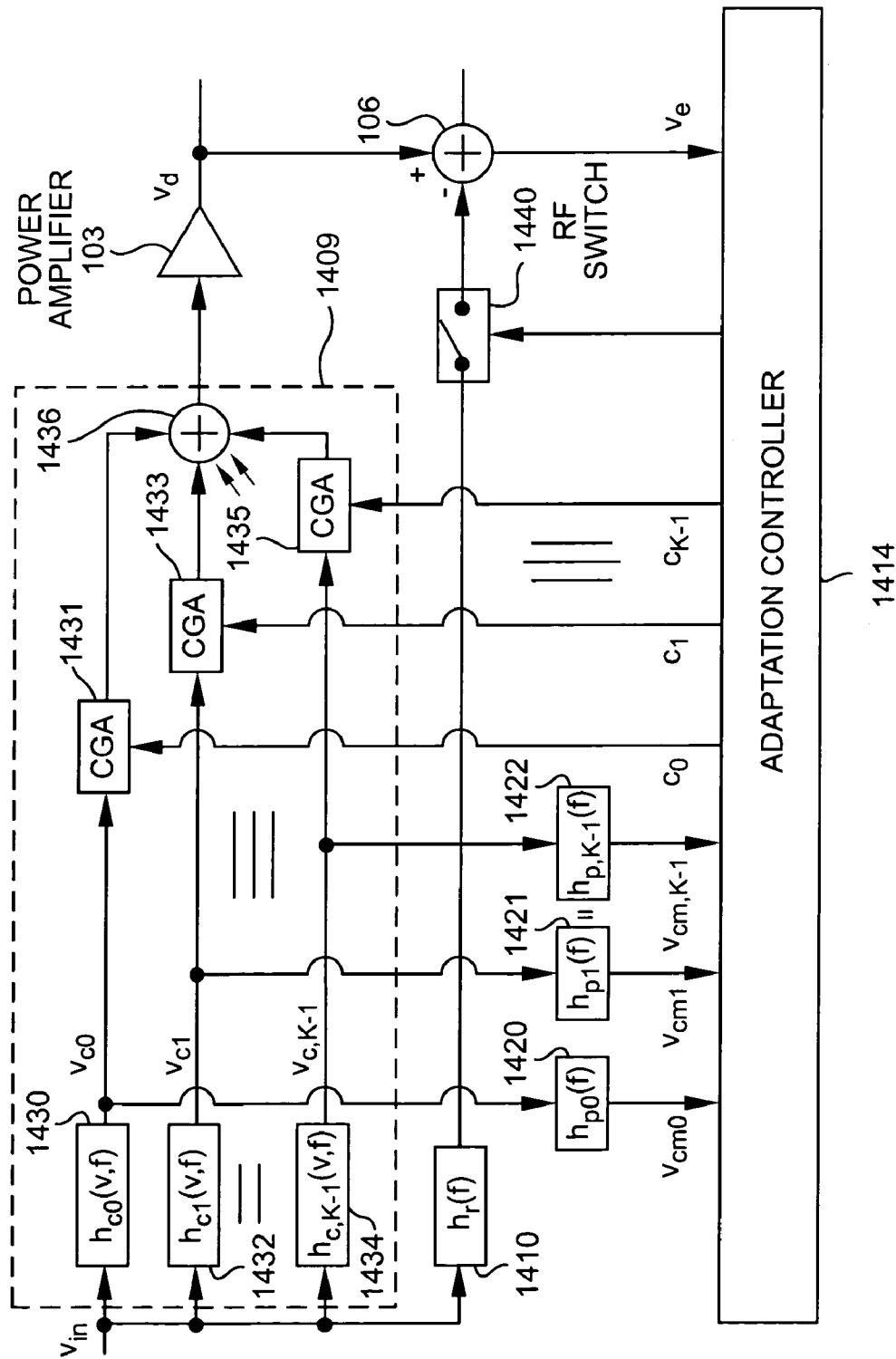
FIG. 9 shows a signal adjuster containing general nonlinearities with frequency dependence.

An example of such a general signal adjuster is shown in FIG. 9. In this case, the adjuster circuit 1409 precedes the power amplifier 103. Branch filters $h_{c0}(v, f)$ to $h_{c,K-1}(v,f)$ (1430, 1432, 1434) are general nonlinearities with possible frequency dependence, as indicated by the two arguments v, the input signal, and f, the frequency. In implementation, they can take the form of monomial (cubic, quintic, etc.) memoryless nonlinearities. More general nonlinearities such as Bessel functions or step functions, or any other convenient nonlinearity, may also be employed. One or more of these branch filters may instead have linear characteristics and frequency dependence. For example, they may take the form of delays or general linear filters, as in the aspect of the invention described immediately above. In the most general form, the branch filters depend on both the input signal and frequency, where such dependencies may be intentional or inadvertent. In this model, the amplifier gain is included in the branch filter responses. The branch filters 1430, 1432, and 1434 respectively precede CGAs 1431, 1433, and 1435, the outputs of which are summed by combiner 1436.

The filter $h_r(f)$ 1410 in the reference branch may also be a simple delay or a more general filter; even if such a filter is not inserted explicitly, $h_r(f)$ 1410 represents the response of the branch. The objective is to determine the responses of the observation filters $h_{p0}(f)$ to $h_{p,K-1}(f)$ (1420, 1421, and 1422) at selected frequencies. For this case, the self-calibration procedure is modified from those discussed above. To determine the response $h_{pk}(f_i)$ of the observation filter k at frequency $f_i$, the adaptation controller performs the following actions:

(1) open the RF switch 1440, thereby disconnecting the filter $h_r(f_i)$ 1410 from the subtractor 106;

(2) apply an input signal containing the frequency components at frequency $f_i$ or use an internal pilot signal generator set to frequency $f_i$;

(3) set all CGA gains other than that for branch k to zero; select the branch-k CGA gain to $c'_k$ and the power of the input signal in some convenient combination to cause the power amplifier to operate at a preselected output power that is common to all branches k and frequencies $f_i$ in this calibration procedure; doing so makes the amplifier gain and phase shift the same for all branches and frequencies during calibration;

(4) use a partial correlator, with local oscillators set to select frequency $f_i$, to produce the correlation of signal $v_e$ with monitor signal $v_{cmk}(f_i)$; the result is: $C_{ecmk}(f_i) = c'_k h^*_{pk}(f_i) P_{ck}(f_i)$, where $P_{ck}(f_i)$ is the power of signal $v_{ck}$ at frequency $f_i$;

(5) use a partial correlator, with local oscillators set to select frequency $f_i$, to produce the correlation of signal monitor $v_{cmk}(f_i)$ with itself; the result is: $C_{cmk}(f_i) = \mathrm{abs}(h_{pk}(f_i))^2 P_{ck}(f_i)$, where abs(x) denotes the absolute value of x;

(6) estimate the branch-k observation filter response at frequency $f_i$ as:

$h_{pk}(f_i) = c'_k C_{cmk}(f_i) / C_{ecmk}(f_i)$.

(7) close the RF switch.

The scope of the invention is to be construed solely by the following claims.

What is claimed is:

1. A linearizer comprising an adaptation controller with M monitor signals input thereto and M control settings output therefrom, wherein the adaptation controller is operable for determining M uncorrelated adjustment settings dependent on the M monitor signals using an inverted signal coorelation matrix having components derived from pairwise bandpass correlations between the M monitor signals, and then for adjusting the M control settings using the M uncorrelated adjustment settings.

2. An amplifier comprising:

a signal cancellation circuit; and a distortion cancellation circuit, wherein at least one of the signal and distortion cancellation circuits comprises an adaptation controller with M monitor signals input thereto and M control settings output therefrom, and wherein the adaptation controller is operable for determining M uncorrelated adjustment settings dependent on the M monitor signals using an inverted signal correlation matrix having components derived from pairwise bandpass correlations between the M monitor signals, and for adjusting the M control settings using the M uncorrelated adjustment settings.

3. A method for an amplifier having an adaptation controller with M monitor signals input thereto and M control settings output therefrom, said method comprising the steps of:

determining M uncorrelated adjustment settings dependent on the M monitor signals using an inverted signal correlation matrix having components derived from pairwise bandpass correlations between the M monitor signals; and adjusting the M control settings using the M uncorrelated adjustment settings.

* * * * *